(12) United States Patent
Lee et al.

(10) Patent No.: US 8,987,699 B2
(45) Date of Patent: Mar. 24, 2015

(54) CONDUCTIVE BRIDGE RESISTIVE MEMORY DEVICE AND METHOD OF MANUFACTURING THE SAME

(71) Applicant: Macronix International Co., Ltd., Hsinchu (TW)

(72) Inventors: Feng-Min Lee, Hsinchu (TW); Yu-Yu Lin, New Taipei (TW); Wei-Chih Chien, New Taipei (TW); Wei-Chen Chen, Taoyuan County (TW); Ming-Hsiu Lee, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 12 days.

(21) Appl. No.: 13/871,040

(22) Filed: Apr. 26, 2013

(65) Prior Publication Data

US 2014/0203235 A1 Jul. 24, 2014

Related U.S. Application Data

(60) Provisional application No. 61/753,981, filed on Jan. 18, 2013.

(51) Int. Cl.
*H01L 29/66* (2006.01)
*H01L 45/00* (2006.01)
*H01L 29/861* (2006.01)
*E04H 17/16* (2006.01)

(52) U.S. Cl.
CPC ........ *H01L 29/66969* (2013.01); *H01L 45/145* (2013.01); *H01L 45/1608* (2013.01); *H01L 29/8615* (2013.01); *E04H 17/16* (2013.01)
USPC .................................. 257/3; 257/4; 438/104

(58) Field of Classification Search
CPC ............. H01L 45/085; H01L 45/1233; H01L 45/1266; H01L 45/145; H01L 45/146; H01L 45/1675; H01L 45/1608; H01L 29/66969; H01L 29/8615
USPC .............................. 257/2, 4, 3; 438/382, 104
See application file for complete search history.

(56) References Cited

U.S. PATENT DOCUMENTS

| | | | |
|---|---|---|---|
| 6,768,157 B2 * | 7/2004 | Krieger et al. | 257/314 |
| 8,134,139 B2 | 3/2012 | Lin et al. | |
| 2004/0170040 A1 * | 9/2004 | Rinerson et al. | 365/26 |
| 2009/0212283 A1 * | 8/2009 | Rathor et al. | 257/43 |
| 2011/0180775 A1 * | 7/2011 | Lin et al. | 257/4 |

OTHER PUBLICATIONS

B. K. Meyer et al., "Binary copper oxide semiconductors: From materials towards devices", Jun. 7, 2012, Wiley-VCH Verlag GmbH & Co. KGaA, Weinheim, Phys. Status Solidi B 249, No. 8, 1487-1509 (2012), pp. 1487-1509.*

* cited by examiner

*Primary Examiner* — William F Kraig
*Assistant Examiner* — Pavel Ivanov
(74) *Attorney, Agent, or Firm* — McClure, Qualey & Rodack, LLP (57) ABSTRACT

A conductive bridge resistive memory device is provided, comprising a first electrode, a memory layer electrically coupled to the first electrode, an ion-supplying layer containing a source of ions of a first metal element capable of diffusion into and out of the memory layer, a semiconductor layer disposed between the memory layer and the ion-supplying layer, and a second electrode electrically coupled to the ion-supplying layer.

16 Claims, 13 Drawing Sheets

CONDUCTIVE BRIDGE RESISTIVE MEMORY DEVICE AND METHOD OF MANUFACTURING THE SAME

This application claims the benefit of U.S. provisional application Ser. No. 61/753,981, filed Jan. 18, 2013, the disclosure of which is incorporated by reference herein in its entirety.

BACKGROUND

1. Field of the Invention

The disclosure relates in general to a conductive bridge resistive memory device and method of manufacturing the same, particularly to a conductive bridge resistive memory device which reduces the defects generating from the high electrical field and improve device performance.

2. Description of the Related Art

Programmable Metallization Cell (PMC) technology for resistive switching is being investigated for use in nonvolatile memory, reconfigurable logic, and other switching applications due to its low current, good scalability, and high programming speed. The resistance switching of PMC devices is manifested by growing and removing conducting bridges through an electrochemical or electrolytic process. Therefore, PCM devices have also been referred to as conducting bridge (CB) devices or electro-chemical EC devices.

Figure 1A:
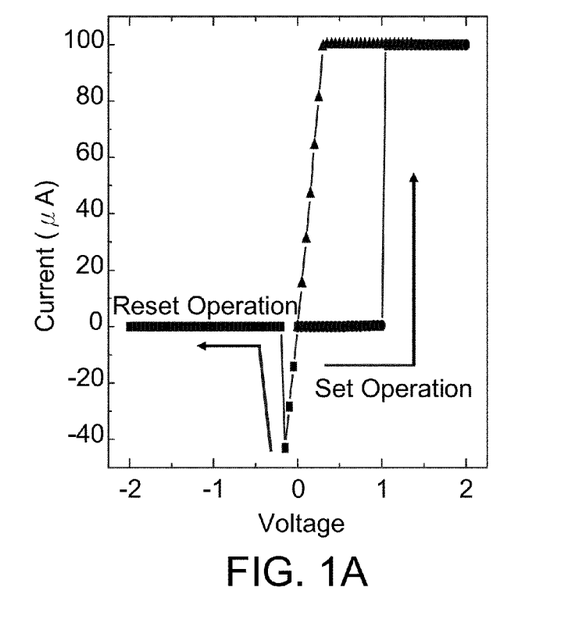
FIG. 1A illustrates a typical resistance switching characteristics of the conductive bridge ReRAM.
Figure 1B:
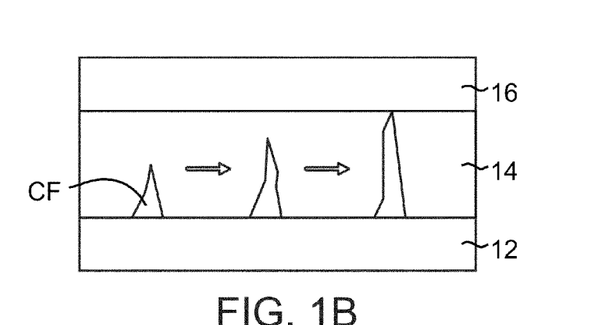
FIG. 1B is sketch of a SET operation of a CB ReRAM cell based on the electrochemical growth process.
Figure 1C:
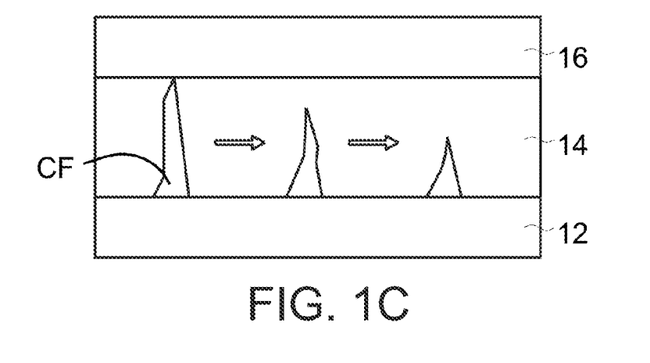
FIG. 1C is a sketch of a RESET operation of a CB ReRAM cell based on the electrochemical disruption process.

Conductive bridge resistive RAM (CB ReRAM) has drawn much interest recently because of its high On-Off ratio, high speed, and good scalability. Please refer to FIG. 1A, FIG. 1B and FIG. 1C. FIG. 1A illustrates a typical resistance switching characteristics of the conductive bridge ReRAM. FIG. 1B is sketch of a SET operation of a CB ReRAM cell based on the electrochemical growth process. FIG. 1C is a sketch of a RESET operation of a CB ReRAM cell based on the electrochemical disruption process. The CB ReRAM cell, as shown in FIG. 1B and FIG. 1C, at least includes a bottom electrode 12, a memory layer 14 (such as silicon dioxide, $SiO_2$) and an ion supplying layer 16 formed on the memory layer 14. The ion supplying layer 16 of chalcogenide, such as $Ge_2Se_2Te_5$ (GST) includes a source of metal ions such as copper. The copper reacts with the chalcogenide to form a Cu-GST compound which could rapidly release copper cations. In SET operation, a bias is applied to the cell which causes the copper cations to migrate into the memory layer 14 and form the conducting filaments (CF) by a process like electro-deposition. When the conducting filaments have grown sufficiently to contact the memory layer 14, a low resistance state (LRS) is achieved. In RESET operation, the cell is reversed biased causing the copper in the conducting filaments (CF) to dissolve in the memory layer 14 and diffuse back to the ion supplying layer 16. When the conducting filaments (CF) are broken, the high resistance state (HRS) is restored. The typical resistance switching characteristics of the CB ReRAM are carried out by electrolytic reactions that form (SET) and disrupt (RESET) the conductive filaments (CF) in the memory layer 14, respectively denoted as LRS and HRS.

Figure 2:
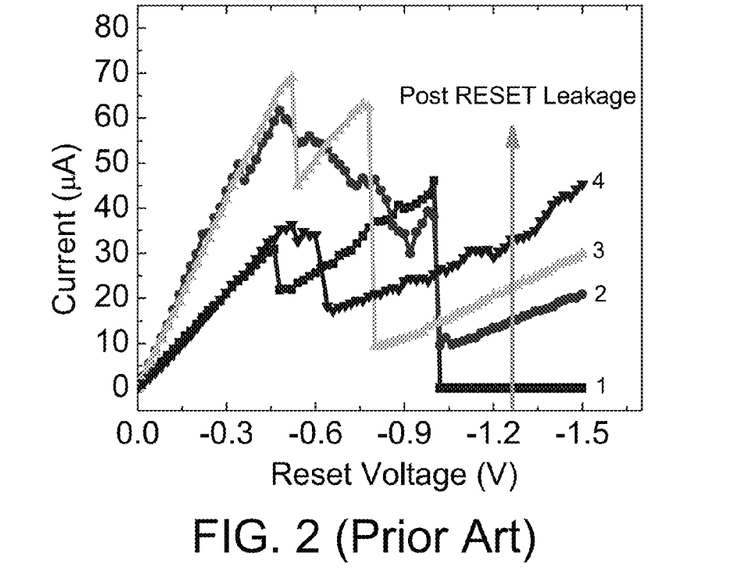
FIG. 2 is I-V characteristics showing that the HRS leakage current monotonically increases with the cycling times.

However, as the SET/RESET cycling continues the leakage current of the memory layer 14 becomes detectable and can be as high as several tens of microampere even after a strong RESET by DC sweep. FIG. 2 is I-V characteristics showing that the HRS leakage current monotonically increases with the cycling times. Thus, it is one of important goals to solve the problem of current leakage.

SUMMARY

The disclosure relates to a conductive bridge resistive memory device and method of manufacturing the same, which reduces the electrical field and prevents the defects generating from the high electrical field, thereby improving the performance of device such as decrease of leakage current.

According to the embodiment, a conductive bridge resistive memory device is provided, comprising a first electrode, a memory layer electrically coupled to the first electrode, an ion-supplying layer containing a source of ions of a first metal element capable of diffusion into and out of the memory layer, a semiconductor layer disposed between the memory layer and the ion-supplying layer, and a second electrode electrically coupled to the ion-supplying layer.

According to the embodiment, a method for manufacturing a conductive bridge resistive memory device is disclosed, comprising forming a first electrode; forming a memory layer electrically coupled to the first electrode; forming an ion-supplying layer containing a source of ions of a first metal element capable of diffusion into and out of the memory layer; forming a semiconductor layer between the memory layer and the ion-supplying layer; and forming a second electrode electrically coupled to the ion-supplying layer.

The disclosure will become apparent from the following detailed description of the preferred but non-limiting embodiments. The following description is made with reference to the accompanying drawings.

DETAILED DESCRIPTION

Figure 3A:
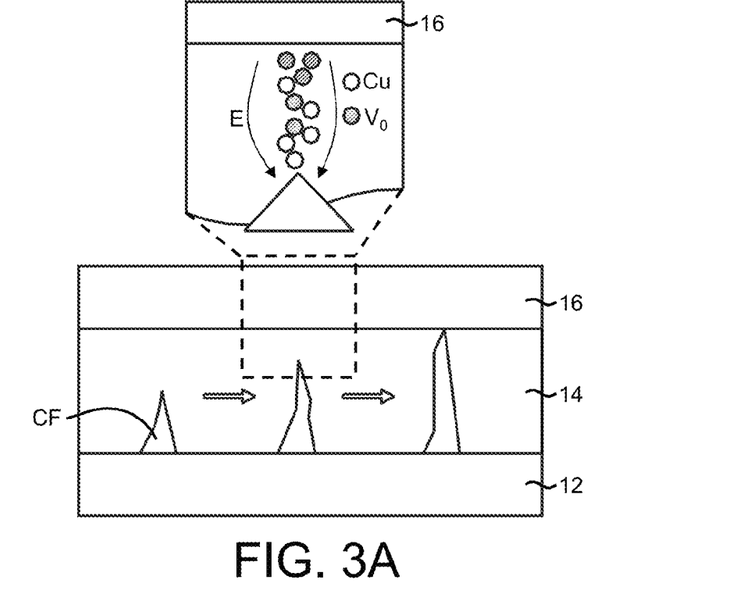
FIG. 3A illustrates the time evolution for the conductive filament (CF) growth, which the defects/vacancies (Vo) are generated by the strong E-field across the narrow gap as the growing CF approaches the ion supplying layer.
Figure 3B:
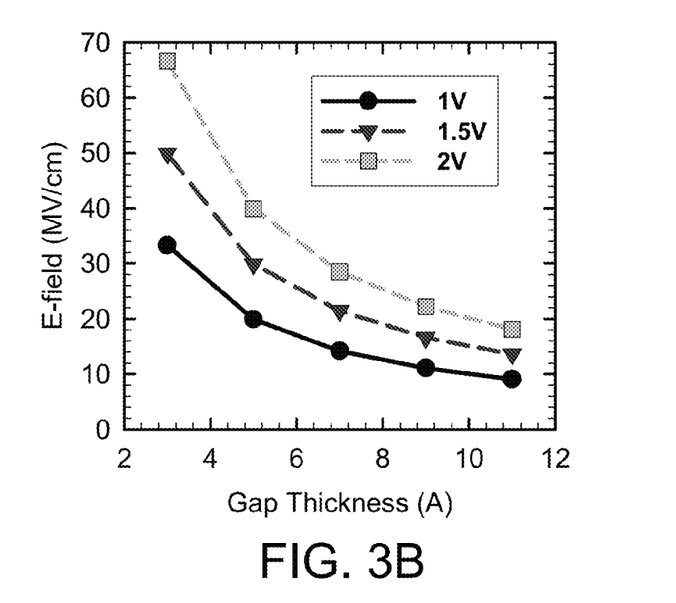
FIG. 3B shows the relationship between gap thickness and E-field at different bias applied to the conductive bridge resistive memory device.

The embodiments of the present disclosure disclosed below are for elaborating a conductive bridge resistive memory device and method of manufacturing the same. FIG. 3A illustrates the time evolution for the conductive filament (CF) growth, which the defects/vacancies (Vo) are generated by the strong E-field across the narrow gap as the growing CF approaches the ion supplying layer. It is proposed in the embodiments that the defects or vacancies (such as oxide vacancies) are generated in the memory layer 14 due to the electrical field in the gap between the growing CF and the ion supplying layer (such as Cu-GST) 16. As a SET operation is performed, the conductive filament gradually grows and the gap between the ion supplying layer 16 and the bottom electrode 12 is getting narrower, which makes the electrical field (E-field) across this gap become stronger. Eventually, the E-field is high enough to generate the defects (such as oxide vacancies) in the memory layer 14. Accordingly, the leakage paths can be formed through those defects/vacancies (Vo), thereby reducing the resistance of the HRS. FIG. 3B shows the relationship between gap thickness and E-field at different bias applied to the conductive bridge resistive memory device. When the voltage applied to the device is increased, the E-field across the gap with the same thickness is increased, thereby inducing more defects in the memory layer 14. Hence, the E-field induced defects/vacancies happened during filament growing should be reduced to improve the device performance.

The embodiments of the present disclosure disclosed below are for elaborating a conductive bridge resistive memory device and method of manufacturing the same. As describe above, it is important to decrease the maximum E-field in the memory layer so as to reduce the damage of the memory layer. The conductive bridge resistive memory device of the embodiment is capable of decreasing the electrical field thereby preventing the oxide defects generating from the high electrical field and improving the device performance.

Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments.

Figure 4:
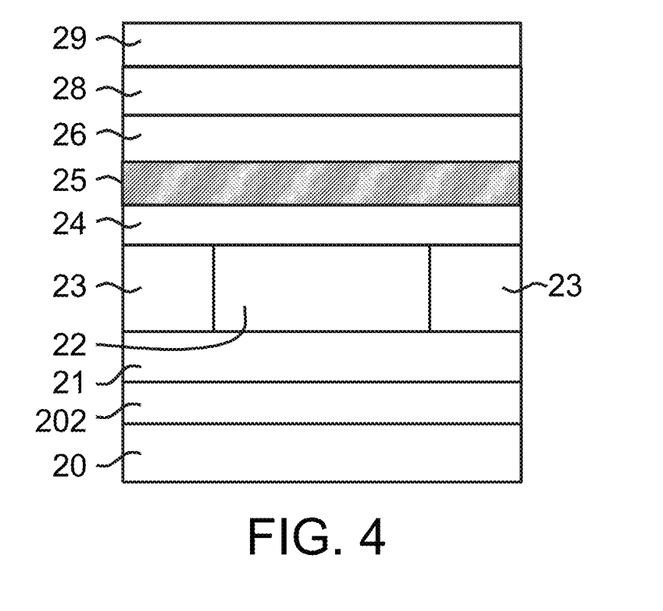
FIG. 4 illustrates a conductive bridge resistive memory device according to the embodiment of the disclosure.

FIG. 4 illustrates a conductive bridge resistive memory device according to the embodiment of the disclosure. As shown in FIG. 4, a conductive bridge resistive memory device comprises a first (bottom) electrode 22, a memory layer 24 electrically coupled to the first electrode 22, an ion-supplying layer 26 containing a source of ions of a first metal element capable of diffusion into and out of the memory layer 24, a semiconductor layer 25 disposed between the memory layer 24 and the ion-supplying layer 26, and a second (top) electrode 28 electrically coupled to the ion-supplying layer 26. According to the embodiment, the semiconductor layer 25 at least comprises one of p-type semiconductor materials and n-type semiconductor materials.

In the embodiment, the conductive bridge resistive memory device could further comprises a first barrier layer 21 and a second barrier layer 29, for respectively blocking diffusion of ions of the first metal element out of the first electrode 22 and the second electrode 28. The first electrode 22 is formed on the first barrier layer 21 and disposed between the memory layer 24 and the first barrier layer 21. The second barrier layer 29 is formed on the second electrode 28, and the second electrode 28 is disposed between the ion-supplying layer 26 and the second barrier layer 29. The first barrier layer 21 and the second barrier layer 29 may comprise other inert electrode materials such as titanium nitride, aluminum, iridium, platinum, titanium and so on.

In the embodiment, the conductive bridge resistive memory device could be formed on a substrate 20 with an insulating layer 202 thereon. The conductive bridge resistive memory device further comprises the inter-metal dielectric (IMD) regions 23 formed on the first barrier layer 21 for separation. The first electrode 22 (such as a tungsten plug) extends through the inter-metal dielectric regions 23 and provides a contact surface on which the memory layer 24 is formed.

According to the embodiment, the memory layer 24 is adapted for electrochemical formation and destruction of a conducting bridge therethrough, and including circuitry to apply bias voltages to the first electrode 22 and the second electrode 28 to induce construction and destruction of the conducting filaments including the first metal element in the memory layer 24. The memory layer 24 may comprise a variety of dielectrics, with common examples including silicon oxides (such as silicon dioxide), silicon nitrides, silicon carbonates, and a variety of metal oxides. In one embodiment, the memory layer 24 is formed on the contact surface of the first electrode 22.

In one embodiment, the semiconductor layer 25 could be a single layer comprising a p-type semiconductor material or an n-type semiconductor material. Alternatively, the semiconductor layer 25 could be a multi-layer comprising a p-type semiconductor layer and an n-type semiconductor layer in a stack. The p-type semiconductor materials, n-type semiconductor materials, or a multi-layer combining both types of semiconductor materials of the semiconductor layer 25 allows diffusion therethrough of the ions. In one embodiment, the semiconductor layer 25 is, but not limited to, p-type CuOx. In one embodiment, the semiconductor layer 25 is formed in contact with the memory layer 24. In one embodiment, a thickness of the semiconductor layer is in range of about 30 Å~100 Å. In another embodiment, a thickness of the semiconductor layer is in range of about 40 Å~50 Å. Those values are disclosed for exemplification, not for limitation, and could be adjusted and changed according to the actual needs of practical application.

The ion-supplying layer 26 may comprise a chalcogenide like Ge2Se2Te5 (referred to herein as GST) with a metal suitable for acting as cations in the electrolytic process such as copper, silver, zinc, and suitable transition metals. In one embodiment, the ion-supplying layer 26 is formed on top of the semiconductor layer 25.

In one embodiment, a second electrode 28 contacts the ion-supplying layer 26. The second electrode 28 may include the metal such as copper, silver, zinc or other suitable transition metal, and act as a source of such metal for the ion-supplying layer 26.

TCAD Simulation

Figure 5A:
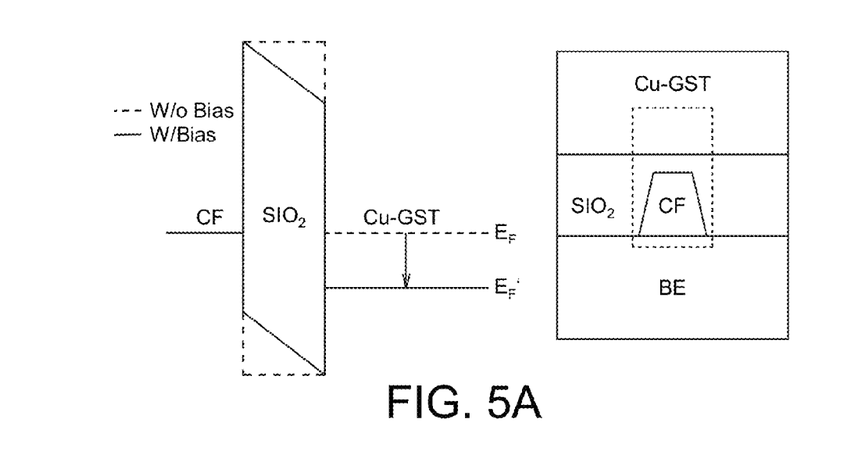
FIG. 5A and FIG. 5B are TCAD simulations for E-field distribution and band-diagram for CF growth in the devices with and without the p-type semiconductor layer, respectively.
Figure 5B:
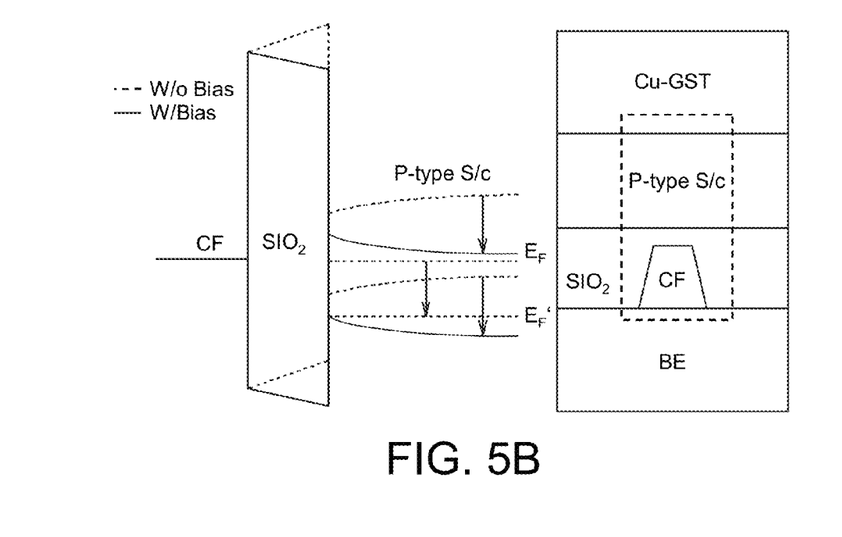

TCAD (technology computer-aided design) simulation has been conducted to investigate the electrical field (E-field) distribution on the conductive bridge resistive memory devices with and without semiconductor layer. A device, including $SiO_2$ as a memory layer, Cu-GST as an ion-supplying layer and a p-type semiconductor layer, is exemplified for TCAD simulation. Another device including $SiO_2$ memory and Cu-GST without p-type semiconductor layer is also adopted in simulation for comparison. FIG. 5A and FIG. 5B are TCAD simulations for E-field distribution and band-diagram for CF growth in the devices with and without the p-type semiconductor layer, respectively.

As shown in FIG. 5A, a conventional CB device is similar to a metal-insulator-metal (MIM) capacitor with the memory layer of $SiO_2$ sandwiched between the metallic second/top electrode (Cu-GST) and the growing Cu filament. The applied SET voltage completely drops across the $SiO_2$ gap and results in a strong E-field (due to the steep band-bending), which may damage the $SiO_2$ layer. By adding a p-type semiconductor layer, the applied SET voltage automatically redistributes between the $SiO_2$ gap and the p-type semiconductor layer, depending on the gap thickness. Thus, the p-type semiconductor layer functions as an E-field modulator (EM) that dynamically reduces the E-field of the CB device.

Figure 6:
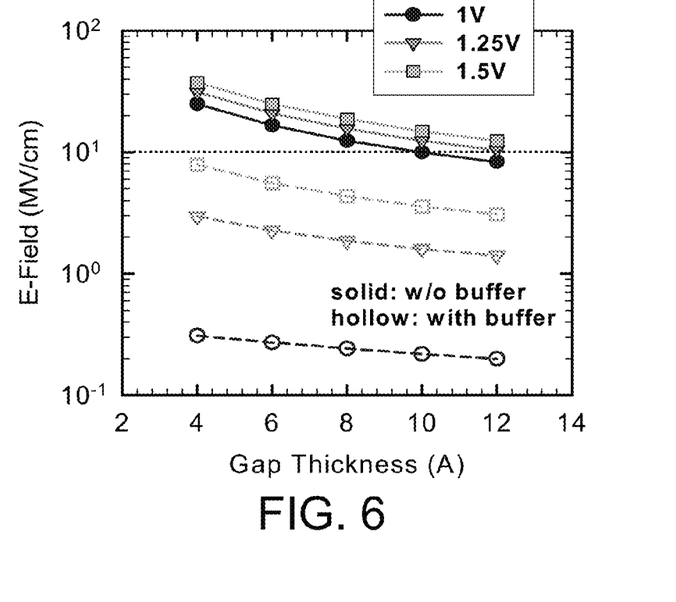
FIG. 6 compares the E-field of the structures of two devices with different thicknesses of the $SiO_2$ gap under different operation bias (1V, 1.25V and 1.5V).

FIG. 6 compares the E-field of the structures of two devices with different thicknesses of the $SiO_2$ gap under different operation bias (1 V, 1.25V and 1.5V). The curves denoted by the solid symbols in FIG. 6 represent the relationship of the gap thicknesses and E-filed of the comparison device (without the p-type semiconductor layer). The curves denoted by the hollow symbols in FIG. 6 represent the relationship of the gap thicknesses and E-filed of the device of the embodiment (with the p-type semiconductor layer). When the Cu filament grows and the $SiO_2$ gap narrows, the EM dynamically controls the increase of the E-field in the memory layer of $SiO_2$, up to 23%, by reducing the voltage drop. The EM helps to retard the rapid increase of the E-file in the memory layer of $SiO_2$ by reducing the voltage for 23%.

Method of Manufacturing CB Device of the Embodiment

Please also refer to FIG. 4 for the construction of the CB device of the embodiment. In the embodiment, a method of manufacturing conductive bridge resistive memory device comprises steps of forming a first electrode 22, forming a memory layer 24 electrically coupled to the first electrode 22, forming an ion-supplying layer 26 containing a source of ions of a first metal element capable of diffusion into and out of the memory layer 24, forming a semiconductor layer 25 between the memory layer 24 and the ion-supplying layer 26, and forming a second electrode 28 electrically coupled to the ion-supplying layer 26, wherein the semiconductor layer 25 at least comprises one of p-type semiconductor materials and n-type semiconductor materials.

Figure 7:
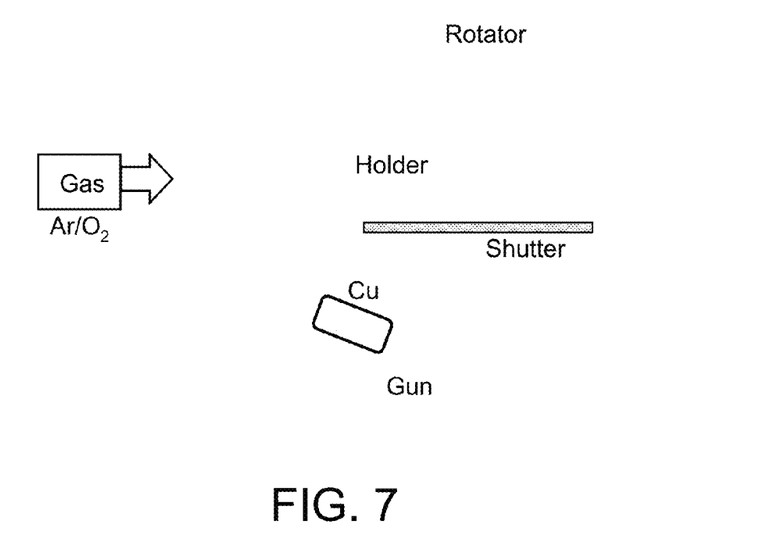
FIG. 7 is a simple drawing of a reactor with reactive sputter according to one manufacturing method of the embodiment.

FIG. 7 is a simple drawing of a reactor with reactive sputter according to one manufacturing method of the embodiment. $CuO_x$ is used as the material of the p-type semiconductor layer in this embodiment. $CuO_x$ is one of the applicable p-type semiconductor materials of the embodiment, and has several advantages such as good process compatibility, wide controllable range of material property, and $CuO_x$ with different oxygen concentration can be achieved by controlling the oxygen flow rate in the sputtering process. In one of the embodiment, a bottom electrode such as W-plug is formed as the first electrode 22, and a $SiO_2$ layer is deposited on the bottom electrode as a memory layer. A $CuO_x$ film is deposited on the $SiO_2$ layer (by sputtering) as a p-type semiconductor layer, and a Cu-GST layer is deposited on the $CuO_x$ film, followed by Cu deposition and patterning to form the top/second electrode on the Cu-GST layer.

Figure 8A:
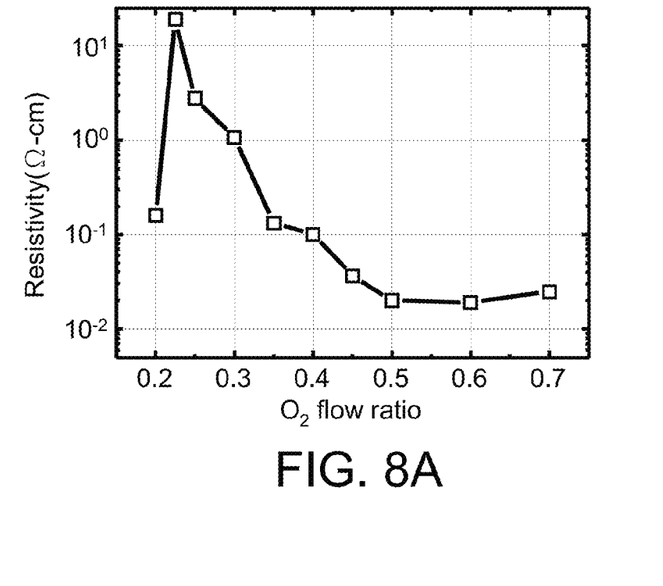
FIG. 8A shows the analysis result of resistivity to oxygen flow ratio for $Ar/O_2$ reactive sputtered CuOx films.
Figure 8B:
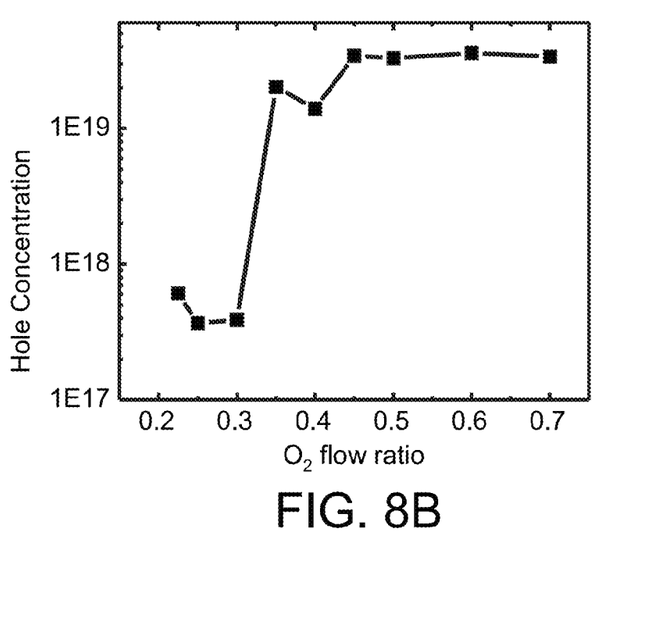
FIG. 8B shows the analysis result of hole concentration (by Hall measurement) to oxygen flow ratio for $Ar/O_2$ reactive sputtered CuOx films.
Figure 8C:
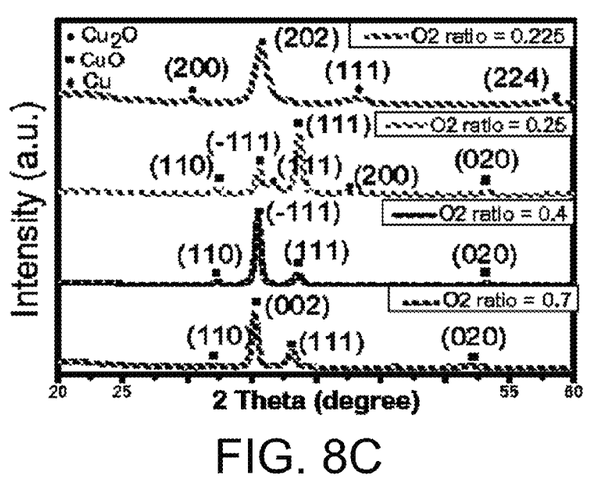
FIG. 8C shows XRD (X-ray diffraction) patterns for Ar/O2 reactive sputtered CuOx films.
Figure 8D:
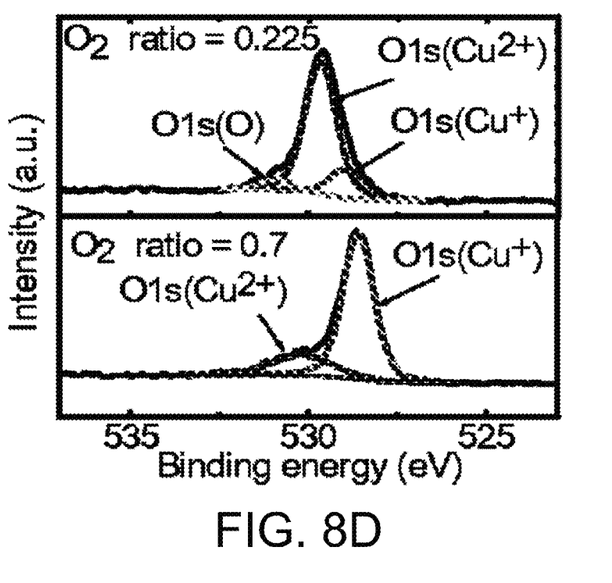
FIG. 8D shows XPS (X-ray photoelectron spectroscopy) spectra for $Ar/O_2$ reactive sputtered CuOx films.

In the experiment, $CuO_x$ is reactively sputtered for a wide range of composition which allows optimizing the $CuO_x$ film (being the p-type semiconductor layer). FIG. 8A shows the analysis result of resistivity to oxygen flow ratio for $Ar/O_2$ reactive sputtered CuOx films. FIG. 8B shows the analysis result of hole concentration (by Hall measurement) to oxygen flow ratio for $Ar/O_2$ reactive sputtered CuOx films. FIG. 8C shows XRD (X-ray diffraction) patterns for Ar/O2 reactive sputtered CuOx films. FIG. 8D shows XPS (X-ray photoelectron spectroscopy) spectra for $Ar/O_2$ reactive sputtered CuOx films. As shown in FIG. 8A and FIG. 8B, three orders of magnitude variation of resistivity and hole concentration are achieved. The resistivity decreases as the $O_2$ flow ratio increases since CuO is more conductive than $Cu_2O$. All samples (i.e. CuOx films) show the p-type semiconductor behavior.

Electrical Characteristics

Figure 9:
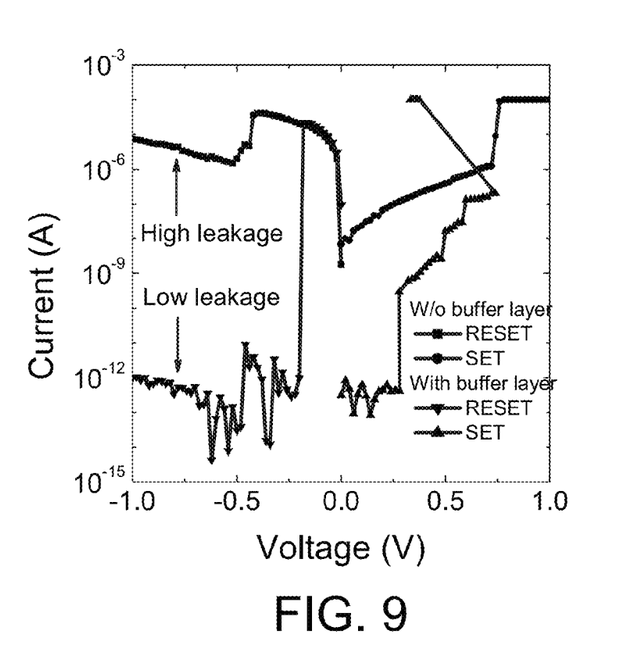
FIG. 9 shows DC I-V characteristics for the comparison CB device without the semiconductor layer and the CB device of the embodiment with the semiconductor layer.

FIG. 9 shows DC I-V characteristics for the comparison CB device without the semiconductor layer and the CB device of the embodiment with the semiconductor layer. In SET operation, both devices switch from HRS to LRS at about 0.75V. In RESET operation, however, the comparison CB device without the p-type semiconductor layer can only switch back to 10 MΩ under negative bias, which indicates the existence of leakage path in the memory layer ($SiO_2$) and the HRS level is limited consequently. It is indicated in FIG. 9 that the leakage current of the comparison CB device without the p-type semiconductor layer always has large leakage current even the device has been reset; however, the leakage current of the CB device of the embodiment with the p-type semiconductor layer is drastically reduced.

Figure 10:
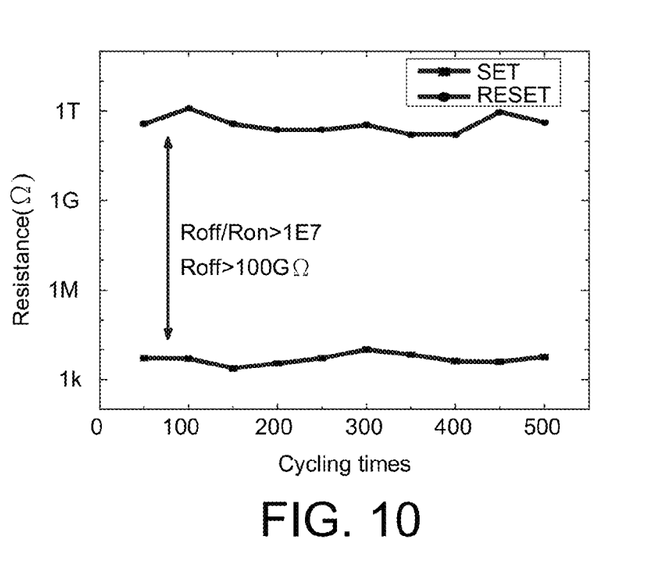
FIG. 10 shows the results of cycling test for the CB device with the semiconductor layer.

Therefore, the memory layer of $SiO_2$ of the comparison CB device has degraded due to high E-field stress during switching, while the CB device of the embodiment is free from $SiO_2$ degradation. FIG. 10 shows the results of cycling test for the CB device with the semiconductor layer. The CB device of the embodiment maintains ultra-high HRS (>100 GΩ reset resistance) with a 7-order On/Off ratio for at least 500 DC-cycles without any sign of $SiO_2$ degradation, as shown in FIG. 10.

Figure 11:
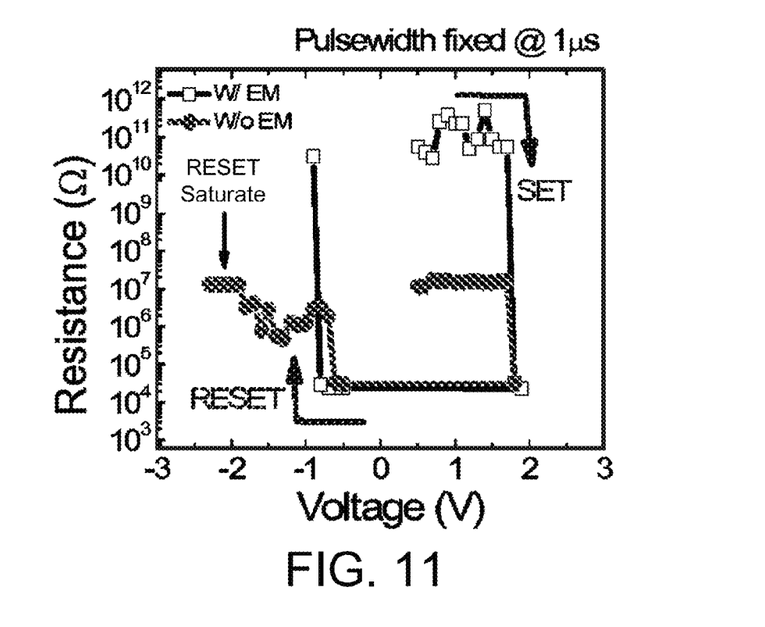
FIG. 11 shows pulse RV curves of the CB device with and without the semiconductor layer.

Pulse switching characteristics of the devices has also been investigated. FIG. 11 shows pulse RV curves of the CB device with and without the semiconductor layer. All voltage pulses are fixed at 1 μs. With pulse width at 1 μs, the RESET voltages are about 1.8V for both devices. The results of resistance levels are similar to that of the DC tests. As shown in FIG. 11, the RESET resistance of the comparison CB device without semiconductor layer achieves a saturated level of about $10^7$Ω, due to defect-induced leakage.

Figure 12:
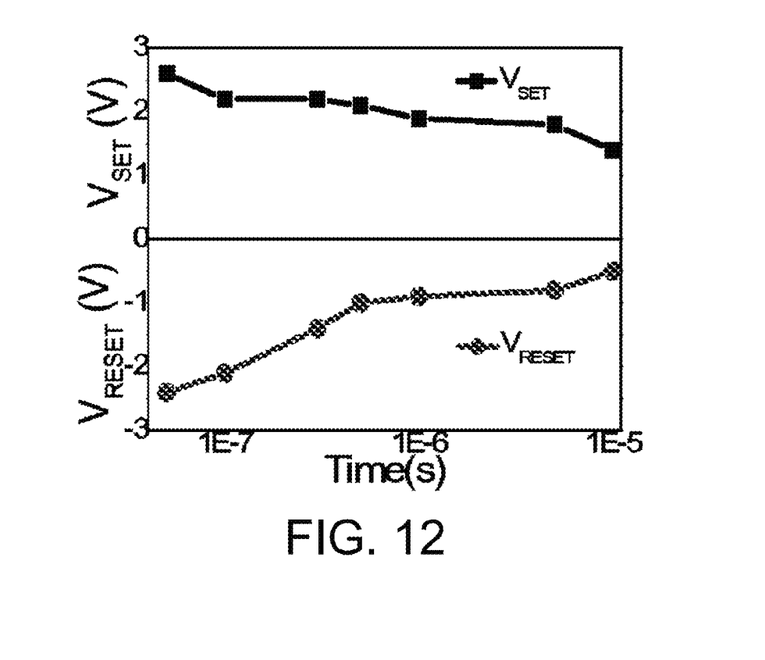
FIG. 12 is the dependence between SET/RESET voltage and pulse width for the CB device of the embodiment.

FIG. 12 is the dependence between SET/RESET voltage and pulse width for the CB device of the embodiment. FIG. 12 shows operation conditions for the CB device with the semiconductor layer. Higher operation voltage is needed for a shorter pulse width. It is evident of the existence of a trade-off between pulse amplitude and pulse width for successful SET and RESET operations, which is common for comparison CB device. Nevertheless, high speed (<50 ns) and low voltage (<3V) programming is achieved for the CB device of the embodiment.

Figure 13:
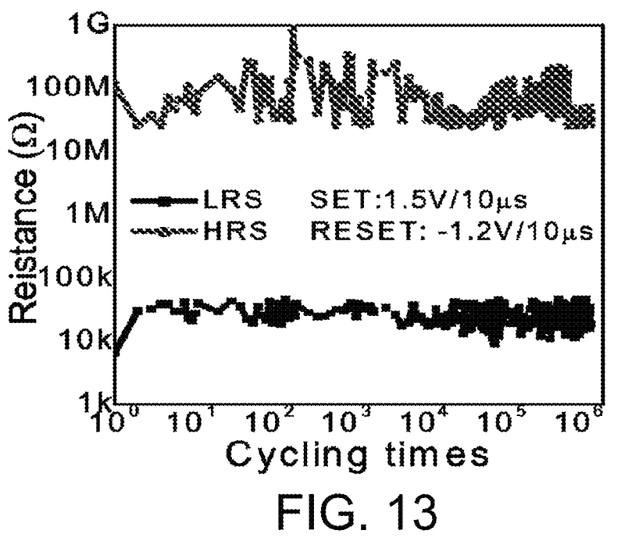
FIG. 13 shows the pulse cycling test results of the CB device of the embodiment.

To reduce the maximum E-field based on the simulation results (as shown in FIG. 6), 1.5V/10 μs of operation condition is chosen for cycling test. FIG. 13 shows the pulse cycling test results of the CB device of the embodiment. The CB device of the embodiment is cycled without any current limiter using 10 μs SET/RESET pulses at 1.5V/−1.2V, as shown in FIG. 13. About 3-order resistance window and over $1.4 \times 10^6$ cycles are achieved. Accordingly, a 3-order resistance window is achieved with endurance improved from 200K (of the typical CB device) to >1 M cycles (of the CB device of the embodiment).

Figure 14:
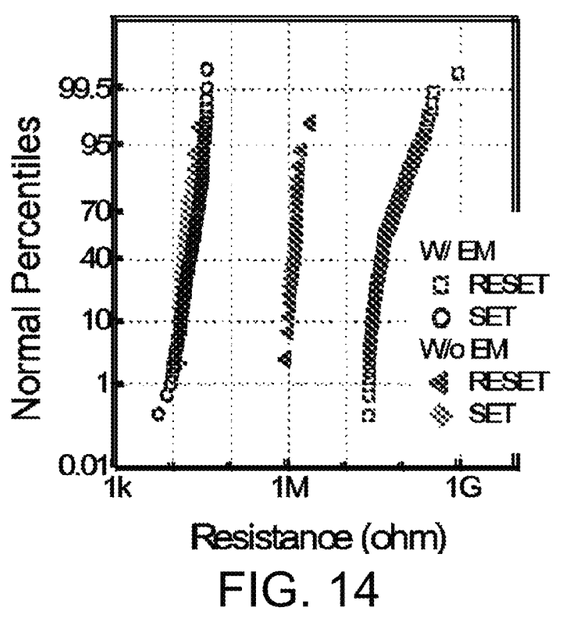
FIG. 14 shows the resistance distribution for the CB devices with and without the semiconductor layer.

FIG. 14 shows the resistance distribution for the CB devices with and without the semiconductor layer (i.e. EM). The resistance window increases from 30× to 1000× with the semiconductor layer. Accordingly, the On/Off ratio of the CB device has been highly improved due to the existence of the semiconductor layer.

Figure 15:
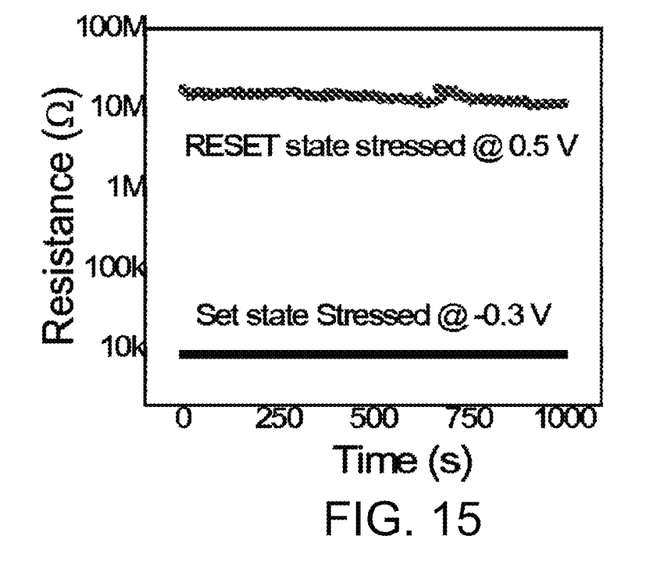
FIG. 15 shows the read stress test result of the CB device with the semiconductor layer according to the embodiment.
Figure 16:
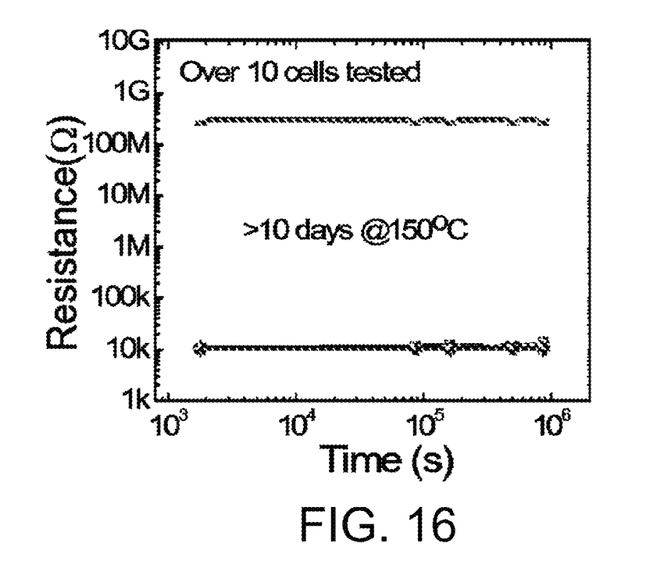
FIG. 16 shows the result of high temperature baking test on the CB device with the semiconductor layer according to the embodiment.

FIG. 15 shows the read stress test result of the CB device with the semiconductor layer according to the embodiment. The read disturb immunity for both SET and RESET states are shown in FIG. 15. Reverse read bias is applied to accelerate the read stress test. No obvious degradation is found for read voltage up to +0.5V for RESET state and −0.3V for SET state. FIG. 16 shows the result of high temperature baking test on the CB device with the semiconductor layer according to the embodiment. The high temperature baking test is conducted at 150° C. for 240 hours, and the result indicates that no resistance degradation during the 150° C., 240 hours bake, which shows the excellent data retention performance for both RESET and SET states, as shown in FIG. 16. The semiconductor layer of the CB device of the embodiment not only reduces the maximum E-field during programming operations, but also acts as a diffusion barrier that prevents the first metal atoms (such as Cu atoms) at the filament tip to back-diffuse into the Cu-GST layer.

Figure 17A:
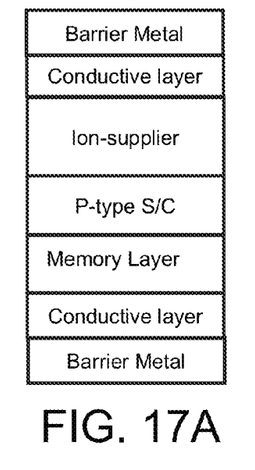
FIG. 17A-FIG. 17D show four different CB devices of the embodiments.
Figure 17B:
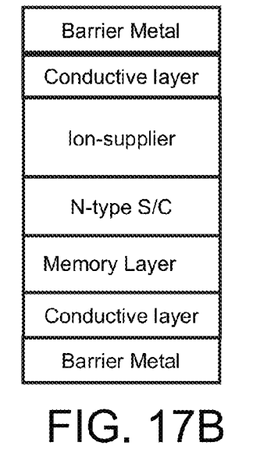
Figure 17C:
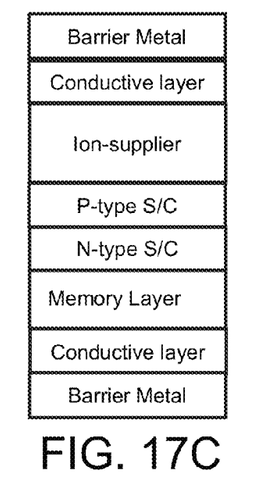
Figure 17D:
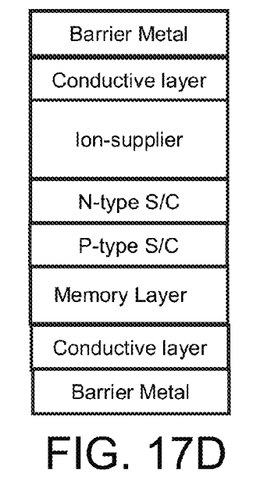

According to the aforementioned description, the conductive bridge resistive memory device of the embodiments dynamically reduces the E-filed so as to prevent the defects of the memory layer. The semiconductor layer of the CB device of the embodiment not only acts an E-field modulator but also serves as a metal (such as Cu) back-diffusion barrier; both greatly improve the device performance. FIG. 17A~FIG. 17D show four different CB devices of the embodiments. Please also refer to FIG. 4 and related description above for the details of the CB structure, which are not repeatedly described. As shown in FIG. 17A, the semiconductor layer is a single layer comprising a p-type semiconductor material (P-type S/C). As shown in FIG. 17B, the semiconductor layer is a single layer comprising an n-type semiconductor material (N-type S/C). As shown in FIG. 17C, the semiconductor layer is a multi-layer comprising a p-type semiconductor layer stacked on an n-type semiconductor layer. As shown in FIG. 17D, the semiconductor layer is a multi-layer comprising an n-type semiconductor layer stacked on a p-type semiconductor layer. However, it is noted that the structures and manufacturing methods as proposed above are provided for illustration, and people who known in the art could adjust and modify the structures and steps based on the knowledge or the steps above. The disclosure is not limited to the structures and steps as disclosed above, and the exemplified structures and steps could be adjusted and changed based on the actual needs of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A conductive bridge resistive memory device, comprising:
   a first electrode;
   a memory layer electrically coupled to the first electrode;
   an ion-supplying layer containing a source of ions of a first metal element capable of diffusion into and out of the memory layer;
   a semiconductor layer disposed between the memory layer and the ion-supplying layer, wherein the semiconductor layer is a multi-layer comprising a p-type semiconductor layer and an n-type semiconductor layer, and the multi-layer allows diffusion therethrough of said ions; and
   a second electrode electrically coupled to the ion-supplying layer.

2. The conductive bridge resistive memory device according to claim 1, wherein the semiconductor layer comprises one of p-type semiconductor materials and n-type semiconductor materials or combination thereof, which allows diffusion therethrough of said ions.

3. The conductive bridge resistive memory device according to claim 1, wherein the semiconductor layer at least comprises p-type CuOx.

4. The conductive bridge resistive memory device according to claim 1, wherein the n-type semiconductor layer is formed on the memory layer, and the p-type semiconductor layer is formed on the n-type semiconductor layer and disposed between the ion-supplying layer and the n-type semiconductor layer.

5. The conductive bridge resistive memory device according to claim 1, wherein the p-type semiconductor layer is formed on the memory layer, and the n-type semiconductor layer is formed on the p-type semiconductor layer and disposed between the ion-supplying layer and the p-type semiconductor layer.

6. The conductive bridge resistive memory device according to claim 1, wherein a thickness of the semiconductor layer is in range of about 30 Å~100 Å.

7. The conductive bridge resistive memory device according to claim 1, wherein the memory layer is adapted for electrochemical formation and destruction of a conducting bridge therethrough, adapted by connecting to a circuitry to apply bias voltages to the first and to the second electrodes to induce construction and destruction of the conducting bridge by a mechanism of electric drift of metal ions in the memory layer.

8. The conductive bridge resistive memory device according to claim 1, further comprising:
   a first barrier layer for blocking diffusion of ions of the first metal element out of the first electrode, the first electrode formed on the first barrier layer and disposed between the memory layer and the first barrier layer; and
   a second barrier layer for blocking diffusion of ions of the first metal element out of the second electrode, the second barrier layer formed on the second electrode, and the second electrode disposed between the ion-supplying layer and the second barrier layer.

9. A method of manufacturing a conductive bridge resistive memory device, comprising:
forming a first electrode;
forming a memory layer electrically coupled to the first electrode;
forming an ion-supplying layer containing a source of ions of a first metal element capable of diffusion into and out of the memory layer;
forming a semiconductor layer between the memory layer and the ion-supplying layer, wherein the semiconductor layer is a multi-layer comprising a p-type semiconductor layer and an n-type semiconductor layer, and the multi-layer allows diffusion therethrough of said ions; and
forming a second electrode electrically coupled to the ion-supplying layer.

10. The method according to claim 9, wherein the semiconductor layer at least comprises one of p-type semiconductor materials and n-type semiconductor materials.

11. The method according to claim 9, wherein the semiconductor layer at least comprises p-type CuOx and is formed by sputtering.

12. The method according to claim 9, wherein the n-type semiconductor layer is formed on the memory layer, and the p-type semiconductor layer is formed on the n-type semiconductor layer and disposed between the ion-supplying layer and the n-type semiconductor layer.

13. The method according to claim 9, wherein the p-type semiconductor layer is formed on the memory layer, and the n-type semiconductor layer is formed on the p-type semiconductor layer and disposed between the ion-supplying layer and the p-type semiconductor layer.

14. The method according to claim 9, wherein a thickness of the semiconductor layer is in range of about 30 Å~100 Å.

15. The method according to claim 9, wherein the memory layer is adapted for electrolytic formation and destruction of a conducting bridge therethrough, adapted by connecting to a circuitry to apply bias voltages to the first and to the second electrodes to induce construction and destruction of the conducting bridge by a mechanism of electric drift of metal ions in the memory layer.

16. The method according to claim 9, further comprising:
forming a first barrier layer for blocking diffusion of ions of the first metal element out of the first electrode, the first electrode formed on the first barrier layer and disposed between the memory layer and the first barrier layer; and
forming a second barrier layer for blocking diffusion of ions of the first metal element out of the second electrode, the second barrier layer formed on the second electrode, and the second electrode disposed between the ion-supplying layer and the second barrier layer.

* * * * *